United States Patent
Chishima et al.

(10) Patent No.: US 11,810,803 B2
(45) Date of Patent: Nov. 7, 2023

(54) LINEAR GAUGE

(71) Applicant: DISCO CORPORATION, Tokyo (JP)

(72) Inventors: Kazufumi Chishima, Tokyo (JP); Takatoshi Urayama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 188 days.

(21) Appl. No.: 17/449,484

(22) Filed: Sep. 30, 2021

(65) Prior Publication Data
US 2022/0122862 A1    Apr. 21, 2022

(30) Foreign Application Priority Data
Oct. 21, 2020   (JP) .................... 2020-176582

(51) Int. Cl.
*H01L 21/67* (2006.01)
*G01B 13/16* (2006.01)
(Continued)

(52) U.S. Cl.
CPC ........ *H01L 21/67253* (2013.01); *F15C 1/005* (2013.01); *G01B 13/00* (2013.01);
(Continued)

(58) Field of Classification Search
CPC ........ G01B 13/00; G01B 13/12; G01B 13/06; G01B 13/02; F15C 1/005
(Continued)

(56) References Cited

U.S. PATENT DOCUMENTS

| 8,965,555 B2 * | 2/2015 | Fukuda ............ B24B 53/017 700/13 |
| 11,285,578 B2 * | 3/2022 | Genozono ......... B24B 49/186 |

(Continued)

FOREIGN PATENT DOCUMENTS

| CN | 103567852 A | * | 2/2014 | .......... B24B 37/005 |
| CN | 115922469 A | * | 4/2023 | ............ B24B 41/04 |

(Continued)

OTHER PUBLICATIONS

Zhang et al., 'Development of an air servo displacement sensor', Precision Engineering (Elsevier Inc.), 2004.01.007, pp. 435-442 (Year: 2004).*

(Continued)

*Primary Examiner* — Stephanie E Bloss
*Assistant Examiner* — Kevin C Butler
(74) *Attorney, Agent, or Firm* — Greer, Burns & Crain, Ltd.

(57) ABSTRACT

A linear gauge includes a contact member having a lower tip to be positioned facing a workpiece; an air slider including a cylinder surrounding the contact member with a clearance left between them, and configured to eject air such that the contact member is supported movably in a vertical direction; a scale that detects a height position of the contact member; a casing accommodating therein the contact member, the air slider, and the scale; an evacuation portion formed in an upper portion of the cylinder such that the ejected air is evacuated into the casing; and a communication channel communicating an inlet, which is formed in an upper portion of the contact member, and an outlet, which is formed in the lower tip of the contact member, with each other inside the contact member.

7 Claims, 4 Drawing Sheets

(51) Int. Cl.
*G01B 13/06* (2006.01)
*G01B 13/00* (2006.01)
*G01B 13/12* (2006.01)
*G01B 13/02* (2006.01)
*F15C 1/00* (2006.01)

(52) U.S. Cl.
CPC .............. *G01B 13/02* (2013.01); *G01B 13/06* (2013.01); *G01B 13/12* (2013.01); *G01B 13/16* (2013.01)

(58) Field of Classification Search
USPC ........................................................ 73/37.5
See application file for complete search history.

(56) References Cited

U.S. PATENT DOCUMENTS

| | | | | |
|---|---|---|---|---|
| 2020/0246936 | A1* | 8/2020 | Shinozaki | B24B 37/16 |
| 2021/0023674 | A1* | 1/2021 | Genozono | B24B 37/30 |
| 2021/0245326 | A1* | 8/2021 | Genozono | B24B 55/02 |
| 2022/0122862 | A1* | 4/2022 | Chishima | G01B 13/16 |
| 2023/0126644 | A1* | 4/2023 | Mori | B24B 7/075 451/8 |

FOREIGN PATENT DOCUMENTS

| | | | | | |
|---|---|---|---|---|---|
| DE | 102021211541 | A1 * | 4/2022 | ............. | G01B 13/16 |
| DE | 102022210063 | A1 * | 4/2023 | ............. | B24B 41/04 |
| JP | 2015175758 | A * | 10/2015 | | |
| JP | 2015175758 | A | 10/2015 | | |
| JP | 2017058174 | A * | 3/2017 | | |
| JP | 2017058174 | A | 3/2017 | | |
| JP | 2017164823 | A * | 9/2017 | | |
| JP | 6302711 | B2 * | 3/2018 | | |
| JP | 6614648 | B2 * | 12/2019 | | |
| JP | 6751301 | B2 * | 9/2020 | | |
| JP | 2021058952 | A * | 4/2021 | | |
| JP | 2022041491 | A * | 3/2022 | | |
| JP | 2022043505 | A * | 3/2022 | | |
| TW | 201417946 | A * | 5/2014 | ........... | B24B 37/005 |

OTHER PUBLICATIONS

Sangsai et al., Contactless Distance Sensor for small air-gap (<10mm) using Linear Hall Effect Sensor, IEEE, Jun. 1, 2023, 5 pg(s) (Year: 2023).*

Sato et al., Confocal probe based on the second harmonic generation for measurement of linear and angular displacements, vol. 31, No. 7/27 Optics Express 11984, Mar. 24, 2023 (Year: 2023).*

Yujiiu et al., A non-contact calibration system for step gauges using automatic collimation techniques, IOP Publising Ltd, 2020, 9 pg(s) (Year: 2020).*

* cited by examiner

LINEAR GAUGE

BACKGROUND OF THE INVENTION

Field of the Invention

The present invention relates to a linear gauge for measuring displacements of a surface of a workpiece such as a semiconductor wafer.

Description of the Related Art

As disclosed, for example, in JP 2015-175758 A and JP 2017-058174 A, a linear gauge measures the height of an upper surface of a wafer by bringing a gauge head (hereinafter called a "contact member"), which is supported movably in a vertical direction, into contact with the upper surface of the wafer and measuring the height of the contact member with a scale.

SUMMARY OF THE INVENTION

The above-described linear gauge of the related art, however, involves a problem that the contact member, which is brought into contact with the wafer, is worn at a lower tip thereof and the height of the upper surface of the wafer can no longer be measured accurately.

The present invention therefore has as an object thereof the provision of a linear gauge that can avoid wearing at a lower tip of its contact member.

In accordance with an aspect of the present invention, there is provided a linear gauge for measuring displacements of a surface of a workpiece, the linear gauge including a contact member having a lower tip to be positioned facing the workpiece; an air slider including a cylinder having an inner supporting wall that surrounds an outer side wall of the contact member with a clearance left between the inner supporting wall and the outer side wall, and configured to eject air from the inner supporting wall such that the contact member is supported movably in a vertical direction; a scale that detects a height position of the contact member; a casing accommodating therein the contact member, the air slider, and the scale; an evacuation portion formed in an upper portion of the cylinder such that the ejected air is evacuated into the casing; and a communication channel communicating an inlet formed in an upper portion of the contact member and an outlet formed in the lower tip of the contact member with each other inside the contact member. The air evacuated from the evacuation portion into the casing is introduced from the inlet into the communication channel and is allowed to blow out from the outlet to provide a clearance between the lower tip of the contact member and the surface of the workpiece, to thereby enable contactless measurement of the displacements of the surface of the workpiece.

Preferably, the linear gauge may further include a casing exhaust port that exhausts the air that has been evacuated into the casing out of the casing; and a valve that adjusts an exhaust rate of the air to be exhausted from the casing exhaust port, in which a distance between the lower tip of the contact member and the surface of the workpiece is adjusted through adjustment of a flow rate of the air flowing through the communication channel by the adjustment of the exhaust rate of the air.

Preferably, the linear gauge may further include a flow rate adjuster disposed in the contact member to adjust a flow rate of the air flowing through the communication channel, in which a distance between the lower tip of the contact member and the surface of the workpiece is adjusted through adjustment of the flow rate of the air flowing through the communication channel by the flow rate adjuster.

According to the linear gauge of the present invention, the air evacuated from the evacuation portion into the casing is introduced from the inlet into the communication channel and is then allowed to blow out from the outlet, whereby a clearance is provided between the lower tip of the contact member and the surface of the workpiece to enable contactless measurement of displacements of the surface of the workpiece. It is hence possible to avoid wearing of the contact member at the lower tip thereof.

Owing to the further inclusion of the casing exhaust port that exhausts the air, which has been evacuated into the casing, out of the casing, and the valve that adjusts the exhaust rate of the air to be exhausted from the casing exhaust port, the exhaust rate of the air to be exhausted out of the casing can be adjusted. As a consequence, the flow rate of the air that flows through the communication channel can be adjusted, thereby enabling adjustment of the distance between the lower tip of the contact member and the surface of the workpiece.

In addition, owing to the further inclusion of the flow rate adjuster disposed in the contact member to adjust the flow rate of the air that flows through the communication channel, the flow rate of the air that flows through the communication channel can be adjusted by the flow rate adjuster. As a consequence, the distance between the lower tip of the contact member and the surface of the workpiece can be adjusted.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
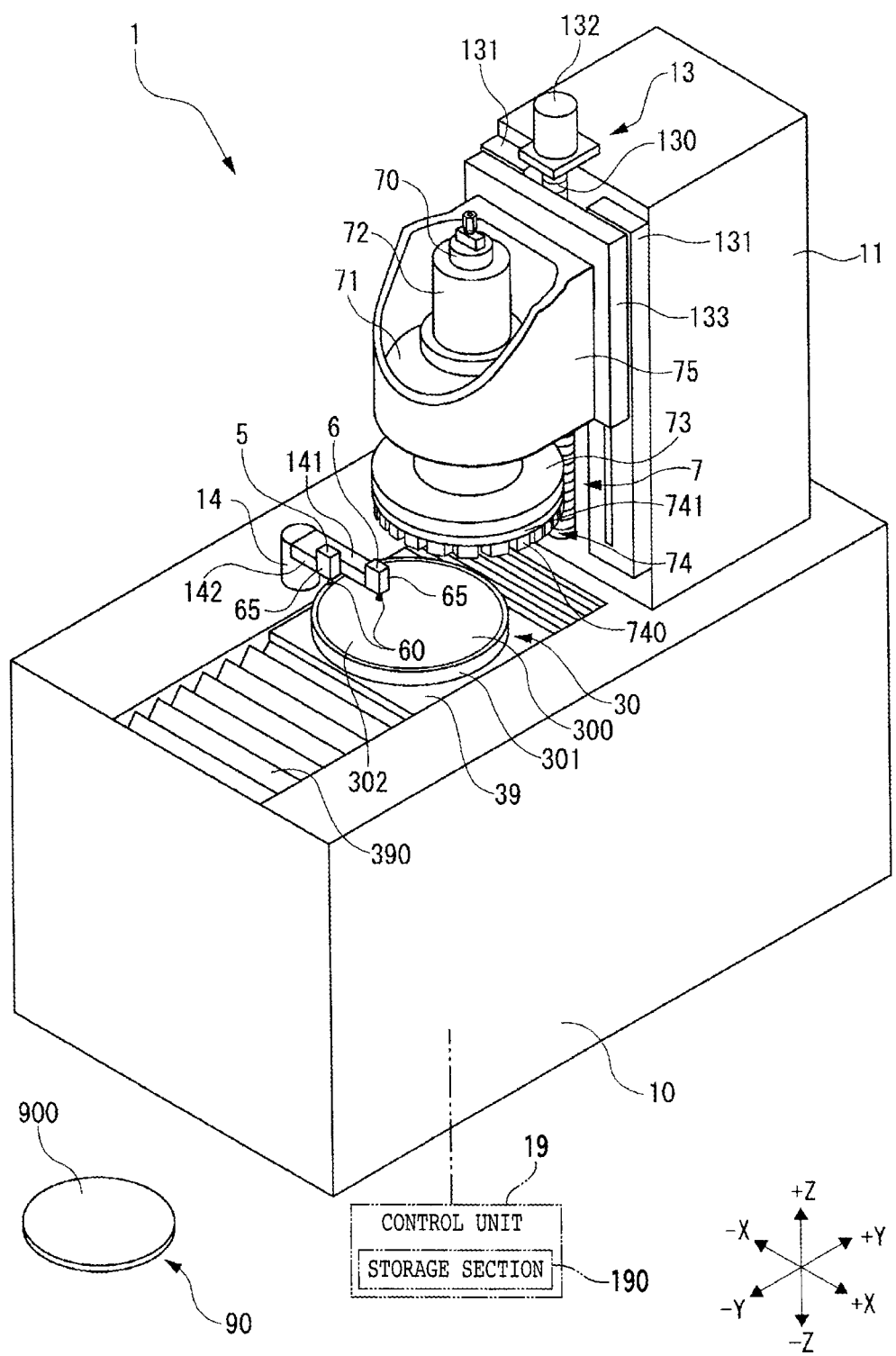
FIG. 1 is a perspective view depicting an example of a processing machine that includes a linear gauge according to an embodiment of the present invention.

Referring first to FIG. 1, a linear gauge 6 according to an embodiment of the present invention will be described. FIG. 1 is a perspective view depicting an example of a processing machine 1 that includes the linear gauge 6 according to the embodiment of the present invention. The processing machine 1 depicted in FIG. 1 is a grinding machine that subjects a workpiece 90, which is held on a chuck table 30, to grinding processing by a grinding unit 7. The processing machine 1 includes a base 10, the length direction of which extends in a Y-axis direction. A front (−Y direction side) section on the base 10 is a region where mounting and dismounting of the workpiece 90 onto and from the chuck table 30 is performed, whereas a rear (+Y direction side) section on the base 10 is a region where grinding of the workpiece 90 held on the chuck table 30 is performed by the grinding unit 7.

A processing machine on which the linear gauge 6 is to be arranged is not limited to a grinding machine having a 1-axis grinding unit like the processing machine 1, and may be a 2-axis grinding machine or the like which includes a coarse grinding unit and a finish grinding unit and can selectively position the workpiece 90 underneath the coarse grinding unit or the finish grinding unit by a rotating turn table. As a further alternative, the linear gauge 6 may also be arranged on a polishing processing machine which applies polishing processing to the workpiece 90 by a polishing pad.

The workpiece 90 is, for example, a circular semiconductor wafer formed of a silicon matrix or the like. The workpiece 90 may be formed of a material other than silicon, such as gallium arsenide, sapphire, gallium nitride, ceramics, resin, silicon carbide, or the like. The workpiece 90 may also be a rectangular package substrate or the like.

The chuck table 30 depicted in FIG. 1 includes a suction holding portion 300 and a frame member 301 supporting the suction holding portion 300. The suction holding portion 300 is formed, for example, from a porous member or the like, and holds the workpiece 90 under suction. The suction holding portion 300 is communicated to a suction source not illustrated, and a suction force produced through an actuation of the suction source is transmitted to a holding surface 302 formed of an exposed surface of the suction holding portion 300 and an upper surface of the frame member 301, whereby the chuck table 30 can hold the workpiece 90 under suction on the holding surface 302.

As depicted in FIG. 1, the chuck table 30 is surrounded by a cover 39, and by table rotary means not illustrated disposed underneath the cover 39, is configured to be rotatable about an axis of rotation that extends in a Z-axis direction. Further, the chuck table 30 is reciprocally movable in the Y-axis direction by a Y-axis moving mechanism not illustrated disposed underneath the cover 39 and a bellows cover 390 connected to the cover 39, both of which are depicted in FIG. 1.

In the grinding region on the base 10 depicted in FIG. 1, a column 11 is disposed upright, and a grinding feed mechanism 13 is disposed on a front wall of the column 11 to effect a grinding feed of the grinding unit 7 away or toward the chuck table 30 in the Z-axis direction (vertical direction). The grinding feed mechanism 13 includes a ball screw 130 having an axis in the vertical direction, a pair of guide rails 131 arranged in parallel to the ball screw 130, a motor 132 connected to an upper end of the ball screw 130 and adapted to rotate the ball screw 130, and an up/down plate 133 maintained in threaded engagement with the ball screw 130 via internal nuts thereof and in sliding contact with the guide rails 131 at side portions thereof. When the motor 132 rotates the ball screw 130, for example, clockwise, the up/down plate 133 is then lowered in the Z-axis direction while being guided by the guide rails 131, thereby effecting a grinding feed of the grinding unit 7, which is fixed on the up/down plate 133, in the Z-axis direction. When the motor 132 rotates the ball screw 130 counterclockwise, on the other hand, the up/down plate 133 is then raised in the Z-axis direction while being guided by the guide rails 131, thereby moving the grinding unit 7 away in the Z-axis direction from the workpiece 90 held under suction on the suction holding portion 300.

The grinding unit 7 that grinds the workpiece 90 held on the chuck table 30 includes a spindle 70 having an axis extending in the Z-axis direction, a housing 71 rotatably supporting the spindle 70, a motor 72 adapted to rotationally drive the spindle 70, a disc-shaped mount 73 connected to a lower end of the spindle 70, a grinding wheel 74 detachably fitted on a lower wall of the mount 73, and a holder 75 supporting the housing 71 and fixed at a side wall thereof on the up/down plate 133 of the grinding feed mechanism 13.

The grinding wheel 74 includes a wheel base 741 having an annular shape as viewed in plan, and a plurality of grinding stones 740 having a substantially parallelepiped shape and arranged in an annular pattern on a lower wall of the wheel base 741. The grinding stones 740 are molded with abrasive grits such as diamond grits stuck together with an appropriate binder, and form grinding surfaces at lower surfaces thereof.

Inside the spindle 70, a flow path is formed extending through the spindle 70 in an axial direction thereof. The flow path is communicated to a grinding water source in which grinding water such as pure water is stored, and serves as a passage for the grinding water. The flow path further extends through the mount 73, and opens in a bottom wall of the wheel base 741 such that the grinding water can be ejected toward the grinding stones 740.

During grinding, the grinding wheel 74 is positioned so as to protrude at a portion thereof from the chuck table 30 in a horizontal direction. Internal nozzles may therefore be arranged on an inner side of the protruding portion of the grinding wheel 74 to eject the grinding water to a position (which may hereinafter be called "the grinding position") where the lower surfaces of the grinding stones 740 come into contact with the workpiece 90.

In order to measure, for example, the thickness of the workpiece 90 during grinding, the processing machine 1 includes, for example, a linear gauge 5 for measuring displacements of the holding surface 302 of the chuck table 30, and another linear gauge 6 for measuring displacements of an upper surface 900 (surface 900) of the workpiece 90 held on the holding surface 302 of the chuck table 30.

At a position on the base 10, the position being located besides a moving path of the chuck table 30 and adjacent the grinding wheel 74 lowered to the grinding position, a linear gauge support column 14 is disposed upright. On a side wall of the linear gauge support column 14, the side wall being located on a +X direction side, a first arm 141 and a second arm 142 are disposed side by side extending horizontally such that the first arm 141 and second arm 142 are located over the moving path of the chuck table 30 and, as viewed in plan, intersect the moving path. Further, the linear gauge 6 is fixed on the side of a distal end of the first arm 141 to measure displacements of the upper surface 900 of the workpiece 90, and the linear gauge 5 is fixed on the side of a distal end of the second arm 142 to measure displacements of the holding surface 302.

The processing machine 1 can measure the thickness of the workpiece 90 sequentially from time to time during grinding by measuring each displacement of the height position of the holding surface 302 as a reference surface by the linear gauge 5, measuring its corresponding displacement of the height position of the upper surface 900 of the workpiece 90 under grinding, and calculating a difference between measurement values by the linear gauge 5 and the linear gauge 6.

The processing machine 1 may omit the linear gauge 5 and may include only the linear gauge 6. If this is the case, the height position of the holding surface 302 of the chuck table 30 is measured by the linear gauge 6 and ascertained in advance. A thickness of the workpiece 90, which has been removed by grinding, can be determined from a difference between the height position of the upper surface 900 of the workpiece 90 held on the holding surface 302 before the grinding and the height position of the upper surface 900 of the workpiece 90 as measured, for example, after the grinding. In addition, the thickness of the workpiece 90 after the grinding can be determined from a difference between the height position of the upper surface 900 of the workpiece 90 as measured after the grinding and the height position of the holding surface 302 of the chuck table 30 as measured in advance.

When measuring the thickness of the workpiece 90 using the linear gauge 5 and the linear gauge 6 as in the present embodiment, with the workpiece 90 not held on the holding surface 302, a contact member 60 of the linear gauge 5 is brought close to the holding surface 302 in a contactless manner and is allowed to float with a clearance of a predetermined width left from the holding surface 302, followed by measurement of the height of the contact member 60 of the linear gauge 5, and a contact member 60 of the linear gauge 6 is brought close to the holding surface 302 in a contactless manner and is allowed to float with a clearance of a predetermined width left from the holding surface 302, followed by measurement of the height of the contact member 60 of the linear gauge 6. Values of the measurements are then made coincident with each other beforehand. In other words, origin adjustment is performed to reduce to zero the difference in height between the measurement values by the respective linear gauges in the above-described measurements. As described above, contactless origin adjustment can be performed between the linear gauge 6 and the linear gauge 5 in the present invention.

Figure 2:
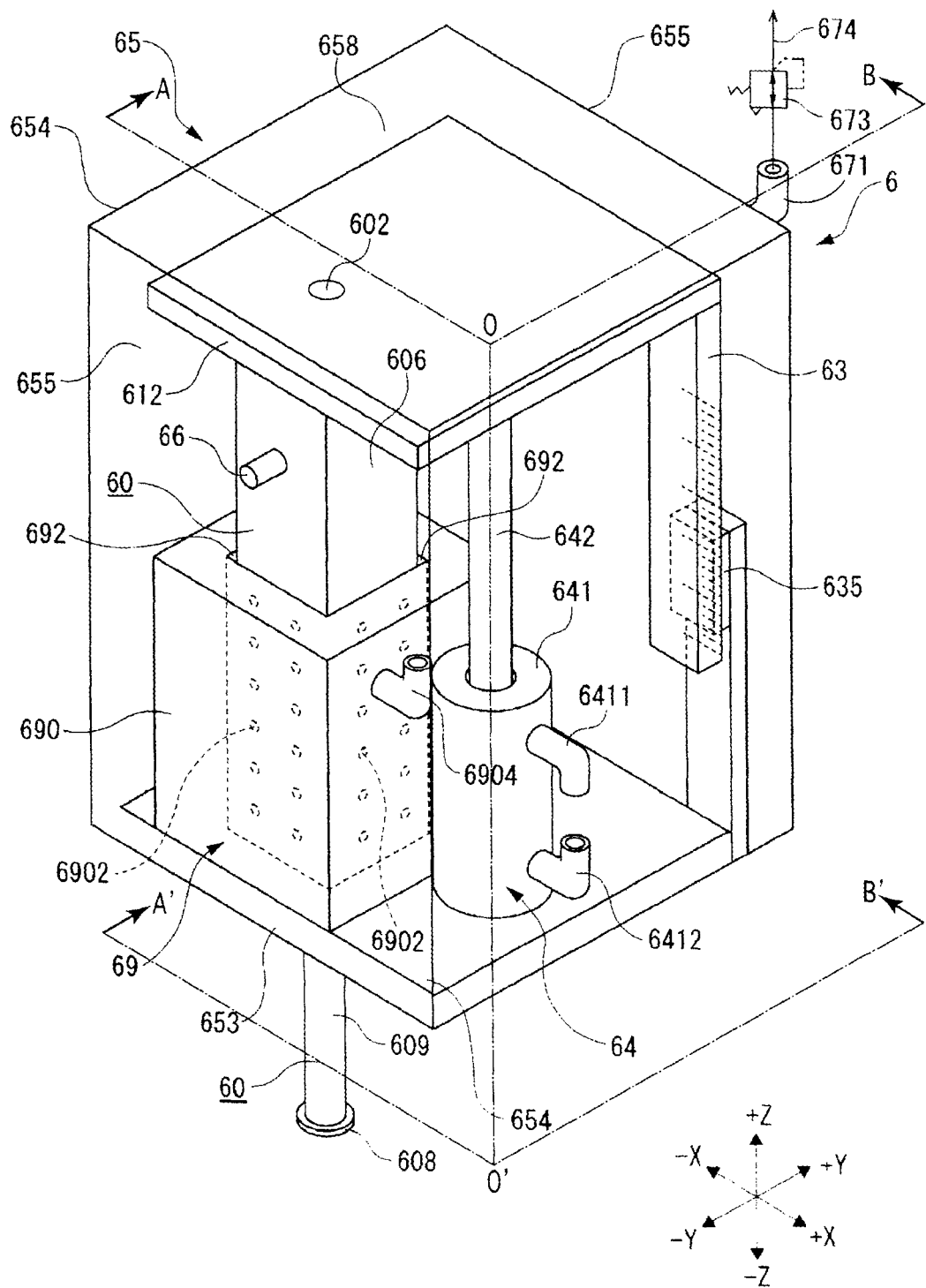
FIG. 2 is a perspective view of the linear gauge in the processing machine of FIG. 1.
Figure 3:
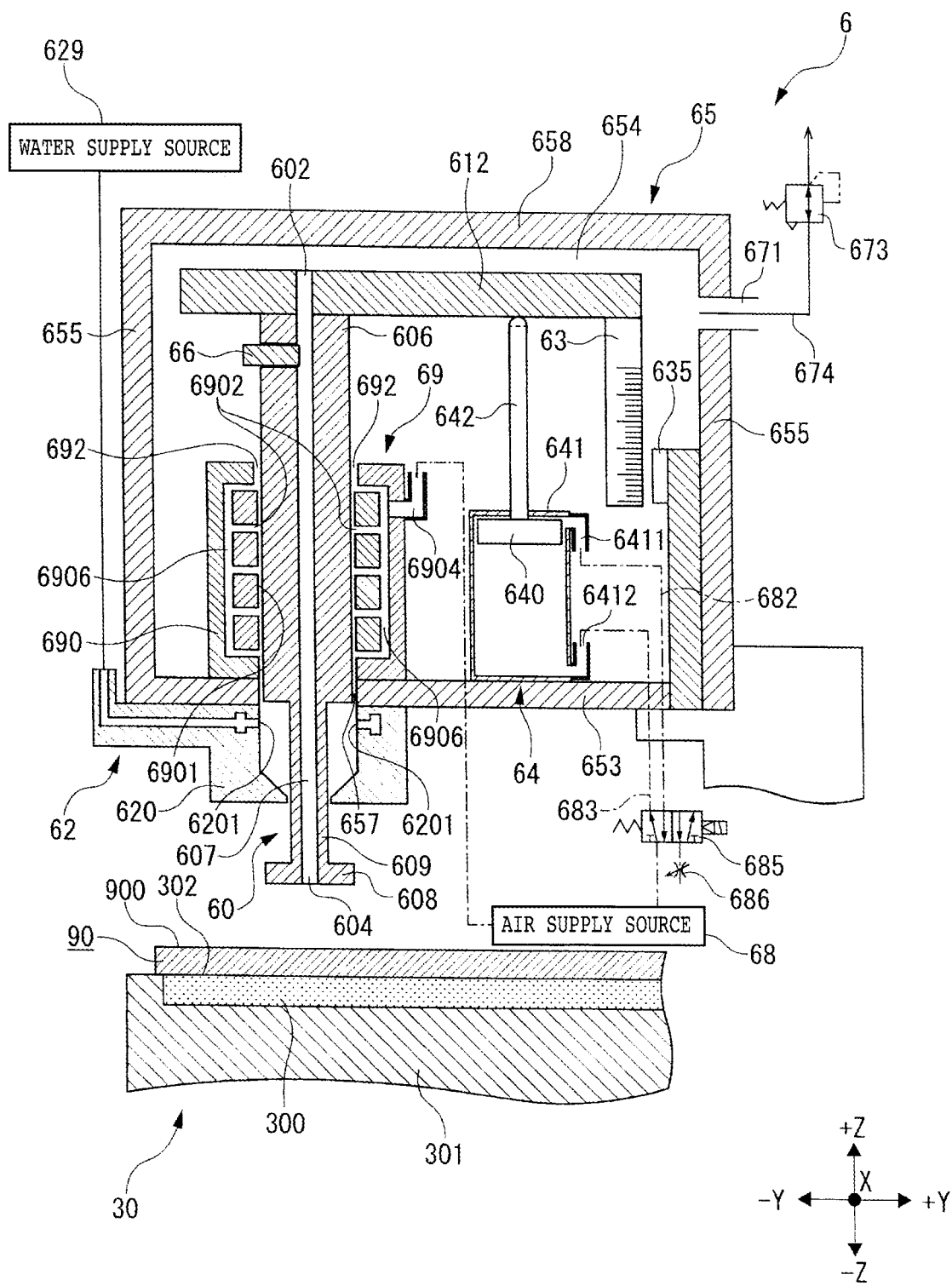
FIG. 3 is a cross-sectional view of the linear gauge taken along lines A-O-B and A'-O'-B' of FIG. 2 when a contact member of the linear gauge has been raised.

As the linear gauge 6 and the linear gauge 5 have a similar configuration, description will hereinafter be made about the configuration of the linear gauge 6 alone with reference to FIGS. 2 and 3. FIG. 2 is a perspective view of the linear gauge 6 in the processing machine 1 of FIG. 1. FIG. 3 is a cross-sectional view of the linear gauge 6 taken along lines A-O-B and A'-O'-B' of FIG. 2 when the contact member 60 of the linear gauge 6 has been raised. The linear gauge 6 depicted in FIGS. 2 and 3 is of a direct drive type, and includes the contact member 60 having a lower tip 608 to be positioned facing the workpiece 90, an air slider 69 including a cylinder 690 having an inner supporting wall 6901, surrounding an outer side wall of the contact member 60 with a clearance left between the inner supporting wall 6901 and the outer side wall, and configured to eject air from the inner supporting wall 6901 such that the contact member 60 is supported movably in a vertical direction, a scale 63 that detects the height position of the contact member 60, a casing 65 accommodating therein the contact member 60, the air slider 69, and the scale 63, an evacuation portion 692 formed in an upper portion of the cylinder 690 such that the ejected air is evacuated into the casing 65, and a communication channel 607 communicating an inlet 602, which is formed in an upper portion of the contact member 60, and an outlet 604, which is formed in the lower tip 608 of the contact member 60, with each other inside the contact member 60.

In the present embodiment, the contact member 60 includes, for example, a middle and upper portion 606 having an external shape in the form of a quadrilateral column, and a circular rod-shaped lower portion 609 formed integrally with the middle and upper portion 606. The middle and upper portion 606 of the contact member 60 is connected on the side of an upper tip thereof to the side of a lower wall of a planar connecting member 612, for example, by fixing nuts not illustrated. The outer side wall of the middle and upper portion 606 is surrounded by the air ejected from the air slider 69, and therefore, serves as a regulating wall that regulates rotation of the contact member 60 with an axis of rotation in the Z-axis direction.

The lower tip 608 of the lower portion 609 of the contact member 60, the lower tip 608 being positioned facing the upper surface 900 of the workpiece 90, is diametrically and horizontally enlarged, for example, in the shape of a flange, and the outlet 604 opens at a center of the lower tip 608. The lower tip 608 has a greater area at a lower surface thereof owing to the diametrical and horizontal enlargement into the shape of the flange, and is hence facilitated to float by air blown out from the outlet 604 as will be described in detail later.

The contact member 60 can be raised by a vertical drive unit 64 such as a piston-cylinder unit, and is allowed to fall under its own weight. The vertical drive unit 64 includes at least a cylinder tube 641 accommodating a piston 640 therein and having a bottom on the side of a proximal end thereof (on a −Z direction side), a rod 642 inserted into the cylinder tube 641 and attached at a lower end thereof to the piston 640, and an air inlet 6411 and an air inlet 6412 for allowing air to flow into the cylinder tube 641. The rod 642 can be brought on the side of an upper end thereof into contact with the lower wall of the connecting member 612, and the cylinder tube 641 is fixed on the side of the proximal end thereof on an upper wall of a bottom plate 653 of the casing 65.

As depicted in FIG. 3, an air supply line 682 and an air supply line 683 are communicated to the air inlet 6411 and the air inlet 6412, respectively, and the air supply line 682 and the air supply line 683 are communicated via a solenoid valve 685 to an air supply source 68 constructed of a compressor or the like.

When desired to raise the contact member 60 by the vertical drive unit 64 to move it apart from the upper surface 900 of the workpiece 90, the piston 640 is raised by supplying air from the air supply source 68 into the cylinder tube 641 via the air inlet 6412 with the solenoid valve 685 positioned to communicate the air supply source 68 and the air supply line 683 with each other. The rod 642 is then brought into contact with the lower wall of the connecting member 612 to raise the connecting member 612, thereby raising the contact member 60 connected to the connecting member 612.

When desired to lower the contact member 60 by the vertical drive unit 64 to bring it close to the upper surface 900 of the workpiece 90, the rod 642 is lowered at a regulated speed by supplying air from the air supply source 68 into the cylinder tube 641 via the air inlet 6411 and allowing air to flow out from the air inlet 6412 with the solenoid valve 685 positioned to communicate the air supply source 68 and the air supply line 682 with each other. As a consequence, the falling speed of the contact member 60 under its own weight can be controlled.

The air slider 69 has the cylinder 690 fixed on the upper wall of the bottom plate 653 of the casing 65, and is configured to enable supporting the outer side wall of the contact member 60 in a contactless manner by inserting the middle and upper portion 606 of the contact member 60 into the cylinder 690.

Corresponding to the shape of the inserted middle and upper portion 606 of the contact member 60, a vertical bore of a quadrilateral shape as viewed in transverse cross-section is formed extending in the Z-axis direction through the cylinder 690 to accommodate the contact member 60 movably up and down. An upper end of the vertical bore with the contact member 60 inserted therein serves as the evacuation portion 692 through which the air ejected from the air slider 69 is evacuated from the cylinder 690 into the casing 65. From a lower end of the cylinder 690, the contact member 60 downwardly projects at primarily the lower portion 609 thereof. The cylinder 690 includes the supporting wall 6901 spacedly surrounding the outer side wall of the middle and upper portion 606 of the contact member 60 with a clearance provided between the inner supporting wall 6901 and the outer side wall, a plurality of ejection nozzles 6902 surrounding the outer side wall of the contact member 60 and configured to eject air from the supporting wall 6901 toward the clearance such that the middle and upper portion 606 of the contact member 60 is supported at the outer side wall thereof, an air supply port 6904 formed through a side wall of the cylinder 690 and communicated to the air supply source 68, and internal flow paths 6906 communicating the air supply port 6904 and the individual ejection nozzles 6902 together.

With the air slider 69 configured as described above, the air is ejected from the individual ejection nozzles 6902 in directions perpendicular to the outer side wall of the middle and upper portion 606 of the contact member 60, whereby the contact member 60 can be surrounded by the air with the interposition of the clearance and can be supported in a contactless state. The external shape of the contact member 60 is not limited to the form of the quadrilateral column, and may be any shape insofar as the contact member 60 does not rotate, in other words, any external shape other than a circular column. Therefore, the contact member 60 may be in the form of a polygonal column or an oval column. As a still further alternative, the contact member 60 may be in the form of a column that is formed in a flat wall at only one side wall thereof and in a curved wall at the remaining side wall or walls. Corresponding to the external shape of the contact member 60, the vertical bore of the cylinder 690 is required to be formed in the shape same as the contact member 60.

Further, the external shape of the contact member 60 may also be in the form of a circular cylindrical column as a whole. In the case of the circular cylindrical column, the air slider 69 includes a guide unit that prohibits rotation of the contact member 60 but permits movement of the contact member 60 in an axial direction. The guide unit includes, for example, a moving magnet connected to the contact member 60 and extending in the axial direction of the contact member 60 (in a −Z direction), and two fixed magnets disposed at a right angle from the cylinder 690 or the bottom plate 653, extending in the axial direction of the contact member 60 (in a +Z direction) and arranged flanking the moving magnet with clearances provided therebetween. Between the fixed magnets and the moving magnet, repulsive forces act in a direction perpendicular to the axial direction of the contact member 60. By these repulsive forces, the contact member 60 can be prevented from rotation.

On a corner of the lower wall of the connecting member 612, the scale 63 is disposed. The scale 63 is fixed at an upper end thereof on the lower wall of the connecting member 612, and extends in the −Z direction in parallel to the extending direction of the contact member 60 (the Z-axis direction). A reading unit 635 that reads graduations of the scale 63 is disposed in the casing 65 such that the reading unit 635 opposes the scale 63. For example, the reading unit 635 is fixed on an inner surface of one of two side walls 655 opposing each other in the Y-axis direction in FIGS. 2 and 3, the one side wall 655 being located on the +Y direction side, is of an optical type that reads light reflected from the graduations of the scale 63, and can read the height position of the lower tip 608 of the contact member 60, in other words, the height position of the upper surface 900 of the workpiece 90.

The communication channel 607 is formed extending in the Z-axis direction from the middle and upper portion 606 to the lower tip 608 through the contact member 60, and the communication channel 607, on the side of an upper end thereof, extends through the connecting member 612 and opens as the inlet 602 in an upper wall of the connecting member 612. Further, the communication channel 607, on the side of a lower end thereof, opens as the outlet 604 in the lower surface of the lower tip 608 of the contact member 60.

As depicted in FIGS. 2 and 3, the casing 65 has a quadrilateral external shape in the present embodiment. Without being limited to such a quadrilateral external shape, however, the casing 65 may have an external shape, for example, in the form of a circular cylindrical column. As depicted in FIGS. 2 and 3, the casing 65 includes, for example, the bottom plate 653 that has a rectangular shape as viewed in plan and is parallel to a horizontal plane, four side walls integrally extending upright in the +Z direction from an outer periphery of the bottom plate 653, and a top plate 658 that has a rectangular shape as viewed in plan, is connected to upper ends of the four side walls, and is parallel to the horizontal plane. The two side walls that oppose each other in the X-axis direction in FIGS. 2 and 3 will be referred to as "side walls 654." The side wall 654 on a −X direction side is fixed at an outer side surface thereof, for example, on a distal end wall of the first arm 141 depicted in FIG. 1.

For example, the side walls 654, side walls 655, and top plate 658 of the casing 65 can be opened and closed by opening/closing means not illustrated such as hinges, and seals or the like not illustrated are arranged at respective connected parts. With the side walls 654, side walls 655, and top plate 658 all closed, it is therefore airtight inside the casing 65, so that the air inside the casing 65 can be selectively exhausted out of the casing 65 from only a casing exhaust port 671 depicted in FIGS. 2 and 3.

A through-hole 657 is formed in the bottom plate 653 of the casing 65, and the lower portion 609 and a portion of the middle and upper portion 606 of the contact member 60 downwardly project out of the casing 65 through the through-hole 657 such that they are movable up and down. Between an outer periphery of the through-hole 657 and the contact member 60, a seal mechanism 62 is disposed, for example.

For example, the seal mechanism 62 includes at least a cylindrical member 620 attached to the lower wall of the bottom plate 653, and a water supply source 629 communicating to the cylindrical member 620, and the cylindrical member 620 includes an inner side wall surrounding the outer side wall of the contact member 60 with a clearance provided therebetween, and water ejection nozzles 6201 configured to eject water from the inner side wall to the outer side wall of the contact member 60. Upon measurement of the height of the upper surface 900 of the workpiece 90, the clearance between the outer side wall of the contact member 60, which projects downward from the casing 65, and the inner side wall of the cylindrical member 620 is filled with the water supplied from the water supply source 629 and ejected from the water ejection nozzles 6201, whereby a water seal is formed to prevent the air inside the casing 65 from leaking out from the through-hole 657.

The linear gauge 6 of the present embodiment includes the casing exhaust port 671 that exhausts the air, which has been evacuated from the air slider 69 into the casing 65, to an outside of the casing 65, and a valve 673, such as an electro-pneumatic regulator or an electrically actuated regulator valve, that adjusts the exhaust rate of the air to be exhausted from the casing exhaust port 671.

In the example depicted in FIGS. 2 and 3, the casing exhaust port 671 is formed through an upper portion of the side wall 655 on the +Y direction side, and an exhaust line 674 such as a metal pipe or a resin tube is communicated to the casing exhaust port 671. The valve 673 is arranged in the exhaust line 674.

The linear gauge 6 of the present embodiment may also include a flow rate adjuster 66, which as depicted in FIGS. 2 and 3 is disposed, for example, in the contact member 60 to adjust the flow rate of air that flows through the communication channel 607 in the contact member 60. For example, the flow rate adjuster 66 can be, but is not limited to, an electrically actuated gate valve which is movable in the horizontal direction to enable a change in the cross-sectional area of the communication channel 607.

As depicted in FIG. 1, the processing machine 1 includes a control unit 19 that performs, for example, control of the entire machine. The control unit 19 is configured of a central processing unit (CPU) or the like, and is electrically connected to individual elements of the processing machine 1. The control unit 19 is electrically connected, for example, to the grinding feed mechanism 13, the grinding unit 7, and the like, and under control by the control unit 19, up/down moving operation of the grinding unit 7 by the grinding feed mechanism 13, rotational operation of the grinding wheel 74 by the grinding unit 7, and the like are performed. The control unit 19 includes a storage section 190 configured of a storage device such as a memory.

The control unit 19 is connected to the reading unit 635 depicted in FIGS. 2 and 3 via a wired or wireless communication path, and the reading unit 635 can transmit to the control unit 19 the height position of the lower tip 608 of the contact member 60, in other words, the height position of the upper surface 900 of the workpiece 90 as read from the scale 63.

The valve 673 depicted in FIGS. 2 and 3 is electrically connected to the control unit 19, and adjusts the exhaust rate of the air, which is to be exhausted from the casing exhaust port 671, in proportion to each electrical signal fed from the control unit 19, so that the pressure of the air in the casing 65 can be adjusted stepless. In other words, the adjustment of the exhaust rate of the air under control by the control unit 19 enables adjustment of the flow rate of the air that flows into the communication channel 607 from the inlet 602 of the contact member 60 disposed in the casing 65 and blows out from the outlet 604 to the outside of the casing 65.

Description will hereinafter be made about operation of the processing machine 1 depicted in FIG. 1 when the workpiece 90 held on the chuck table 30 is ground on the processing machine 1. In the mounting/dismounting region, the workpiece 90 is mounted on the holding surface 302 of the chuck table 30 with their centers substantially registered with each other. A suction force produced by the suction source not illustrated is then transmitted to the holding surface 302, whereby the chuck table 30 holds the workpiece 90 under suction on the holding surface 302.

Next, the chuck table 30 with the workpiece 90 held under suction thereon is moved in a +Y direction from the mounting/dismounting region to underneath the grinding unit 7 in the grinding region, and the chuck table 30 is positioned such that the center of rotation of the grinding stones 740 of the grinding unit 7 is offset by a predetermined distance in the horizontal direction relative to the center of rotation of the workpiece 90 and the trajectory of rotation of the grinding stones 740 passes through the center of rotation of the workpiece 90.

Figure 4:
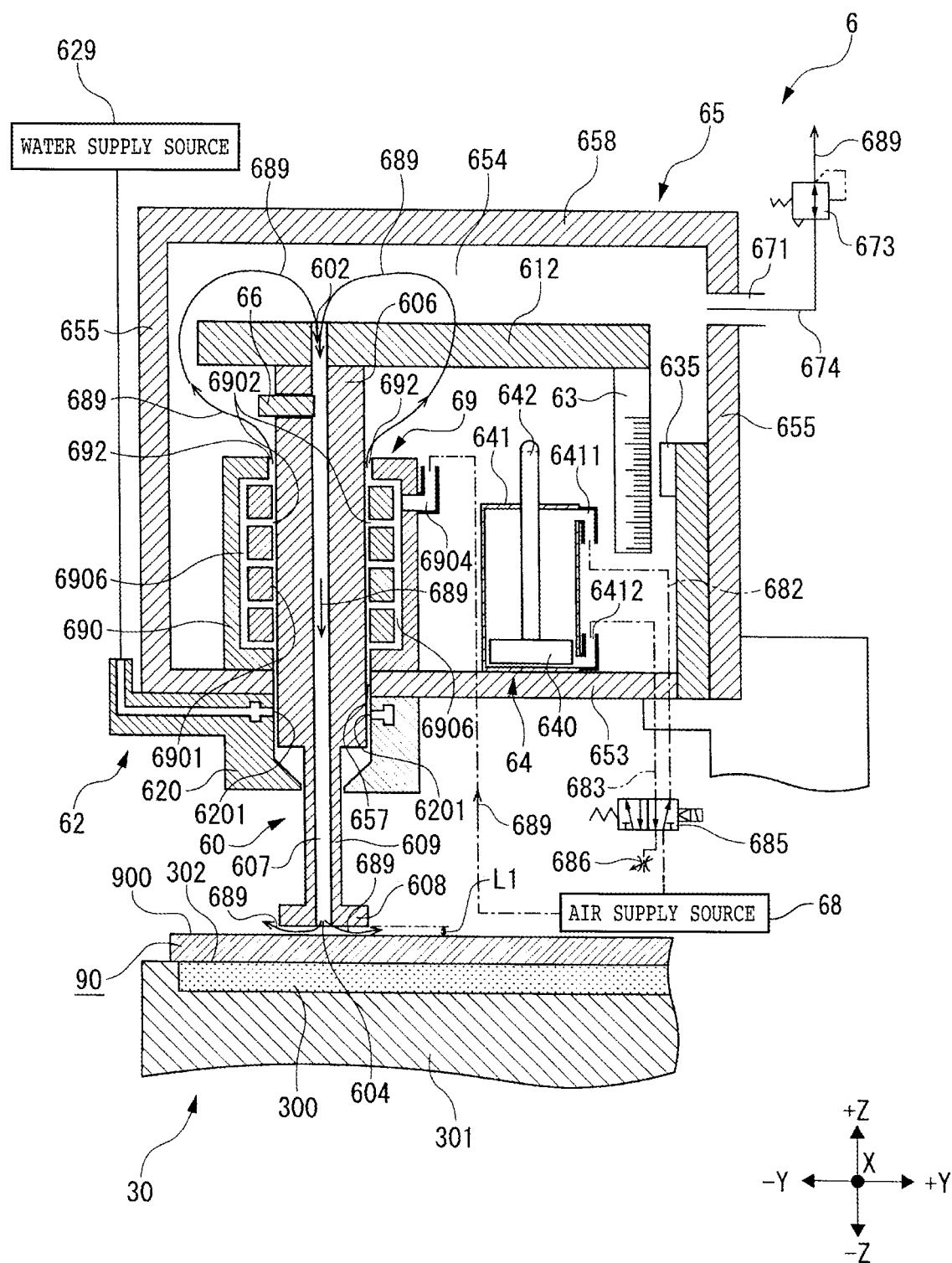
FIG. 4 is a cross-sectional view of the linear gauge taken along lines A-O-B and A'-O'-B' of FIG. 2 when the contact member of the linear gauge is measuring displacements of a surface of a workpiece in a contactless manner.

The above-described origin adjustment between the linear gauge 6 and the linear gauge 5 has already been performed, for example, before actually performing grinding on the processing machine 1. Now, reference is made to FIG. 4. FIG. 4 is a cross-sectional view of the linear gauge 6 taken along lines A-O-B and A'-O'-B' of FIG. 2 when the contact member 60 of the linear gauge 6 is measuring displacements of the upper surface 900 of the workpiece 90 in a contactless manner. As depicted in FIG. 4, the vertical drive unit 64 first lowers the contact member 60 in the −Z direction such that the contact member 60 comes close to the upper surface 900 of the workpiece 90. Described specifically, with a supply port of the solenoid valve 685 communicated to the air supply line 682, the air supply source 68 supplies air from the air inlet 6411 into the cylinder tube 641, whereby the air in the cylinder tube 641 is purged at a predetermined flow rate from the air inlet 6412 into the atmosphere via a flow rate adjustment valve 686. As a consequence, the piston 640 is moved at a regulated speed in a downward direction (the −Z direction) inside the cylinder tube 641. The downward moving speed of the contact member 60, which would otherwise fall primarily under its own weight, is therefore controlled at a regulated speed.

Here, air is supplied from the air supply source 68 to the air supply port 6904 of the air slider 69, and the air is ejected from the ejection nozzles 6902 toward the outer side wall of the contact member 60, whereby motion of the contact member 60 in the direction of its rotation about the Z-axis as an axis of rotation is regulated by its outer side wall that plays a role as a regulating surface while the contact member 60 is supported by the air slider 69 in a contactless manner. If the contact member 60 as a whole is in the form of a circular cylindrical column, the air slider 69 as described above includes the guide portion that has the moving magnet and the fixed magnets to regulate the motion of the contact member 60 in the direction of its rotation.

On the other hand, the grinding unit 7 depicted in FIG. 1 is fed in the −Z direction by the grinding feed mechanism 13, and the rotating grinding stones 740 are brought into contact with the upper surface 900 of the workpiece 90 to perform grinding. During the grinding, in association with rotation of the chuck table 30 at a predetermined rotational speed, the workpiece 90 held on the holding surface 302 also rotates, so that the grinding stones 740 perform grinding processing of the entire upper surface 900 of the workpiece 90. During the grinding processing, grinding water is supplied to the position of contact between the grinding stones 740 and the upper surface 900 of the workpiece 90, for example, through the spindle 70, whereby the position of contact is cooled and cleaned.

When the grinding of the workpiece 90 by the grinding stones 740 is initiated, the height position of the holding surface 302 as a reference surface is measured in a contactless manner by the linear gauge 5 depicted in FIG. 1, and varying height positions of the upper surface 900 of the workpiece 90 under grinding are measured in a contactless manner by the linear gauge 6 with the contact member 60 lowered close to the upper surface 900 of the workpiece 90 as described above. The control unit 19 calculates differences between measurement values by the two gauges, so that the thickness of the workpiece 90 is sequentially measured during the grinding.

In a specific measurement example of displacements of the height position of the upper surface 900 of the workpiece 90 by the linear gauge 6, the difference between each measurement value of the height of the contact member 60 of the linear gauge 6, the contact member 60 floating with a clearance of a predetermined width L1 left from the upper surface 900 of the workpiece 90 as depicted in FIG. 4, and its corresponding measurement value of the height of the contact member 60 of the linear gauge 5, the contact member 60 floating with a clearance of a predetermined width left from the holding surface 302 of the chuck table 30, gives the thickness of the workpiece 90.

In other words, the contact member 60 of the linear gauge 6 is caused to float at the predetermined distance above the workpiece 90 by air such that the contact member 60 remains out of contact with the workpiece 90. Described specifically, by supplying air 689 from the air supply source 68 to the air supply port 6904 of the air slider 69 and ejecting the air 689 from the ejection nozzles 6902 toward the outer side wall of the contact member 60 as depicted in FIG. 4, the air 689 is evacuated from the evacuation portion 692 in the upper portion of the cylinder 690 into the casing 65 while supporting the contact member 60 by the air slider 69 in a contactless manner.

With the air 689 evacuated from the evacuation portion 692 into the casing 65, the interior of the casing 65 is progressively filled, and the air 689 progressively flows from the inlet 602 in the upper portion of the contact member 60 into the communication channel 607. The air 689 then blows out downward from the outlet 604 and flows radially outward along the lower surface of the lower tip 608 of the contact member 60, so that the contact member 60 floats such that it separates upward from the upper surface 900 of the workpiece 90. As a consequence, the linear gauge 6 is now ready to measure displacements of the upper surface 900 of the workpiece 90 in a contactless manner with the clearance of the predetermined width L1, for example, of the µm order provided between the lower tip 608 of the contact member 60 and the upper surface 900 of the workpiece 90.

Concerning the provision of the clearance of the predetermined width L1 between the upper surface 900 of the workpiece 90 before grinding and the lower surface of the lower tip 608 of the contact member 60 at the time of initiation of measurement of the height, the clearance of the predetermined width L1 can be realized with ease by reproducing the flow rate of the air blown out from the outlet 604 of the contact member 60, for example, when the clearance of a predetermined width is provided between the holding surface 302 and the lower surface of the lower tip 608 of the contact member 60 of the linear gauge 6 upon the origin adjustment, because the flow rate of the blowing air at the time of the origin adjustment is stored in the storage section 190 of the control unit 19.

The supply rate per unit time (for example, a volume greater than at least 1 L/min) of the air 689 to be supplied from the air supply source 68 to the air slider 69 is maintained constant. In the present embodiment, there are two exhaust ports for the air in the casing 65, one being the outlet 604 of the contact member 60, the other the casing exhaust port 671 of the casing 65. The magnitude of the predetermined width L1 of the clearance between the upper surface 900 of the workpiece 90, the upper surface 900 progressively lowering by the grinding, and the lower surface of the lower tip 608 of the contact member 60, the lower surface also progressively lowering following the lowering upper surface 900, is therefore maintained during the grinding processing, for example, by adjusting and controlling the exhaust rate of the air 689, which is to be exhausted from the casing exhaust port 671 via the valve 673, by the control unit 19 depicted in FIG. 1. Described specifically, the opening of the valve 673 is adjusted in proportion to electrical signals fed from the control unit 19 to the valve 673, so that the exhaust rate of the air 689 to be exhausted from the casing exhaust port 671 is maintained at a predetermined exhaust rate during the grinding processing. As a consequence, the flow rate of the air 689, which flows through the communication channel 607, is adjusted to a constant rate, and therefore the volume of the air 689, which blows out from the outlet 604, is maintained constant.

If the linear gauge 6 does not include the casing exhaust port 671 and the valve 673, for example, the flow rate adjuster 66 depicted in FIG. 4 may be moved in the horizontal direction to change the cross-sectional area of the communication channel 607, so that the flow rate of the air 689, which flows through the communication channel 607, is adjusted to the constant rate. As a consequence, the volume of the air 689, which blows out from the outlet 604, can be maintained constant such that the magnitude of the predetermined width L1 of the clearance between the upper surface 900 of the workpiece 90, the upper surface 900 progressively lowering by the grinding, and the lower surface of the lower tip 608 of the contact member 60, the lower surface also progressively lowering following the lowering upper surface 900, is maintained constant during the grinding processing.

As the height position of the upper surface 900 progressively lowers from the height position at the input thickness, the height position serving as a reference, through grinding of the upper surface 900 of the workpiece 90 by rotation of the grinding stones 740 depicted in FIG. 1, the contact member 60 progressively lowers while allowing the constant volume of air 689 to blow out from the outlet 604 depicted in FIG. 4 and maintaining the clearance at the predetermined width L1. In parallel with this progressive lowering of the contact member 60, the varying height position of the upper surface 900 of the workpiece 90 is sequentially measured at every unit time in a contactless manner by the scale 63 and the reading unit 635, and information of the measurement results is fed to the control unit 19 depicted in FIG. 1.

In addition, displacements of the height position of the holding surface 302 of the chuck table 30 are also continuously and sequentially measured in a contactless manner by the linear gauge 5 during the grinding by substantially the same operation as in the above-described contactless measurement of the displacements of the height position of the upper surface 900 of the workpiece 90 by the linear gauge 6. The control unit 19 then calculates the difference between each measurement value of the linear gauge 6 and its corresponding measurement value of the linear gauge 5, whereby the thickness of the workpiece 90 is sequentially measured during the grinding.

After the workpiece 90 is ground to a desired thickness while measuring its thickness as described above, the grinding unit 7 is moved upward and away from the workpiece 90 under control by the control unit 19. Further, the contact member 60 is also raised upward (in the +Z direction) apart from the workpiece 90 by the vertical drive unit 64 depicted in FIG. 4. Described specifically, with the supply port of the solenoid valve 685 switched to a position where the supply port is communicated to the air supply line 683 (the position depicted in FIG. 3), the air supply source 68 supplies air from the air inlet 6412 into the cylinder tube 641 to raise the piston 640. The rod 642 is hence raised, so that the contact member 60 is raised together with the connecting member 612 and the contact member 60 is separated from the workpiece 90. As a consequence, the grinding of the workpiece 90 is completed.

The linear gauge 6 according to the present invention for measuring displacements of the upper surface 900 of the workpiece 90 includes the contact member 60 having the lower tip 608 to be positioned facing the workpiece 90, the air slider 69 including the cylinder 690 having the inner supporting wall 6901, surrounding the outer side wall of the contact member 60 with a clearance left between the inner supporting wall 6901 and the outer side wall, and configured to eject air from the inner supporting wall 6901 such that the contact member 60 is supported movably in a vertical direction, the scale 63 that detects the height position of the contact member 60, the casing 65 accommodating therein the contact member 60, the air slider 69, and the scale 63, the evacuation portion 692 formed in the upper portion of the cylinder 690 such that the ejected air is evacuated into the casing 65, and the communication channel 607 communicating the inlet 602, which is formed in the upper portion of the contact member 60, and the outlet 604, which is formed in the lower tip 608 of the contact member 60, with each other inside the contact member 60. Therefore, by introducing the air, which has been evacuated from the evacuation portion 692 into the casing 65, from the inlet 602 into the communication channel 607 and allowing it to blow out from the outlet 604, a clearance can be provided between the lower tip 608 of the contact member 60 and the upper surface 900 of the workpiece 90 to enable contactless measurement of displacements of the upper surface 900 of the workpiece 90, and wearing of the lower tip 608 of the contact member 60 can be avoided.

The lower tip 608 of the contact member 60 remains out of contact with the upper surface 900 of the workpiece 90. Even if the upper surface 900 of the workpiece 90 is irregular, no tilting force is hence applied to the contact member 60, so that the thickness of the workpiece 90 can be accurately measured.

The linear gauge 6 according to the present invention may adjust the exhaust rate of the air, which is to be exhausted from the casing exhaust port 671, by further including the casing exhaust port 671 that exhausts the air, which has been evacuated into the casing 65, out of the casing 65, and the valve 673 that adjusts the exhaust rate of the air to be exhausted from the casing exhaust port 671. The adjustment of the exhaust rate of the air enables adjustment of the flow rate of the air flowing through the communication channel 607, and hence, adjustment of the distance between the lower tip 608 of the contact member 60 and the upper surface 900 of the workpiece 90.

The linear gauge 6 according to the present invention may adjust the flow rate of the air, which flows through the communication channel 607, by further including the flow rate adjuster 66 disposed in the contact member 60. The adjustment of the air, which flows through the communication channel 607, enables adjustment of the distance between the lower tip 608 of the contact member 60 and the upper surface 900 of the workpiece 90.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A linear gauge for measuring displacements of a surface of a workpiece, the linear gauge comprising:
    a contact member having a lower tip to be positioned facing the workpiece;
    an air slider including a cylinder having an inner supporting wall that surrounds an outer side wall of the contact member with a clearance left between the inner supporting wall and the outer side wall, and configured to eject air from the inner supporting wall such that the contact member is supported movably in a vertical direction;
    a scale that detects a height position of the contact member;
    a casing accommodating therein the contact member, the air slider, and the scale;
    an evacuation portion formed in an upper portion of the cylinder such that the ejected air is evacuated into the casing; and
    a communication channel communicating an inlet formed in an upper portion of the contact member and an outlet formed in the lower tip of the contact member with each other inside the contact member, the communication channel not being open to a space between the contact member and the inner supporting wall of the cylinder that surrounds the outer side wall of the contact member,
    wherein the air evacuated from the evacuation portion into the casing is introduced from the inlet into the communication channel and is allowed to blow out from the outlet to provide a clearance between the lower tip of the contact member and the surface of the workpiece, to thereby enable contactless measurement of the displacements of the surface of the workpiece.

2. The linear gauge according to claim 1, further comprising:
    a casing exhaust port that exhausts the air that has been evacuated into the casing out of the casing; and
    a valve that adjusts an exhaust rate of the air to be exhausted from the casing exhaust port,
    wherein a distance between the lower tip of the contact member and the surface of the workpiece is adjusted through adjustment of a flow rate of the air flowing through the communication channel by the adjustment of the exhaust rate of the air.

3. The linear gauge according to claim 1, further comprising:
    a flow rate adjuster disposed in the contact member to adjust a flow rate of the air flowing through the communication channel,
    wherein a distance between the lower tip of the contact member and the surface of the workpiece is adjusted through adjustment of the flow rate of the air flowing through the communication channel by the flow rate adjuster.

4. The linear gauge according to claim 1 wherein the contact member includes an upper portion having an external shape in the form of a quadrilateral column and a circular rod-shaped lower portion.

5. The linear gauge according to claim 4 wherein the cylinder defines a vertical bore of a quadrilateral shape as viewed in transverse cross-section is formed extending in the Z-axis direction through the cylinder to accommodate the contact member and permit the contact member to move up and down while inhibiting the contact member from rotating about the Z-axis direction.

6. The linear gauge according to claim 1 wherein the lower tip is diametrically and horizontally enlarged and the outlet opens at a center of the lower tip.

7. The linear gauge according to claim 1, further comprising a vertical drive unit and wherein the contact member can be raised by the vertical drive unit and is allowed to fall under its own weight.

* * * * *